(12) United States Patent
Leobandung (10) Patent No.: US 10,361,300 B2
(45) Date of Patent: Jul. 23, 2019

(54) ASYMMETRIC VERTICAL DEVICE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/444,573

(22) Filed: Feb. 28, 2017

(65) Prior Publication Data

US 2018/0248034 A1   Aug. 30, 2018

(51) Int. Cl.
| H01L 29/78 | (2006.01) |
| H01L 29/66 | (2006.01) |
| H01L 29/423 | (2006.01) |
| H01L 29/10 | (2006.01) |
| H01L 29/08 | (2006.01) |
| H01L 29/06 | (2006.01) |
| H01L 27/088 | (2006.01) |
| H01L 21/8234 | (2006.01) |
| H01L 29/51 | (2006.01) |

(52) U.S. Cl.
CPC .. *H01L 29/7827* (2013.01); *H01L 21/823418* (2013.01); *H01L 21/823481* (2013.01); *H01L 21/823487* (2013.01); *H01L 27/088* (2013.01); *H01L 29/0649* (2013.01); *H01L 29/0847* (2013.01); *H01L 29/1037* (2013.01); *H01L 29/4238* (2013.01); *H01L 29/6653* (2013.01); *H01L 29/66666* (2013.01); *H01L 29/7835* (2013.01); *H01L 29/517* (2013.01)

(58) Field of Classification Search
None
See application file for complete search history.

(56) References Cited

U.S. PATENT DOCUMENTS

| 8,183,627 | B2 | 5/2012 | Currie |
| 9,041,095 | B2 | 5/2015 | Masuoka et al. |
| 9,607,899 | B1 * | 3/2017 | Cheng ............. H01L 21/823487 |
| 9,640,636 | B1 * | 5/2017 | Bentley ............. H01L 29/66666 |
| 2002/0177265 | A1 * | 11/2002 | Skotnicki ............ H01L 21/2807 438/200 |
| 2006/0038242 | A1 | 2/2006 | Hsu et al. |
| 2010/0032548 | A1 | 2/2010 | Murata |
| 2010/0270611 | A1 * | 10/2010 | Masuoka ........ H01L 21/823885 257/329 |
| 2014/0030859 | A1 | 1/2014 | Xie et al. |

(Continued)

OTHER PUBLICATIONS

Baek, et al., "Characteristics of gate-all-around silicon nanowire field effect transistors with asymmetric channel width and source/drain doping concentration", Journal of Applied Physics 112, 034513 (2012).*

(Continued)

*Primary Examiner* — Erik Kielin
(74) *Attorney, Agent, or Firm* — Scully, Scott, Murphy & Presser, P.C.; L. Jeffrey Kelly, Esq.

(57) ABSTRACT

A vertical FET with asymmetrically positioned source region and drain region is provided. The source region of the vertical FET is separated from a gate electrode by a gate dielectric and the drain region of the vertical FET is separated from the gate electrode by a drain spacer formed therebetween.

10 Claims, 6 Drawing Sheets

(56) References Cited

U.S. PATENT DOCUMENTS

2015/0380548 A1* 12/2015 Wang ................. H01L 29/7827
  257/329
2016/0380101 A1* 12/2016 Mason ................ H01L 29/7838
  257/348
2017/0133513 A1   5/2017 Hong et al.
2018/0006023 A1   1/2018 Nowak et al.
2018/0175040 A1   6/2018 Kim et al.

OTHER PUBLICATIONS

Ghandhi, Sorab K., VLSI Fabrication Principles, 2nd ed. John Wiley and Sons: New York, p. 258 (Year: 1994).*
List of IBM Patents or Patent Applications Treated as Related, dated Nov. 15, 2017, 2 pages.
Notice of Allowance dated Dec. 13, 2018 received in U.S. Appl. No. 15/813,395.

* cited by examiner

ASYMMETRIC VERTICAL DEVICE

BACKGROUND

The present application relates to semiconductor device fabrication, and more particularly, to the fabrication of asymmetric vertical field effect transistors (FETs).

Field Effect Transistors (FETs) are essential components of all modern electronic products. In its basic form, a FET device includes a source, a drain, a channel region between the source and the drain, and a gate electrode over the channel region to regulate electron flow between the source and the drain. In a conventional symmetric planar FET structure, the source region and the drain region are symmetrically positioned with respect to the gate electrode. There is an intrinsic trade-off between source/drain series resistance and gate to source/drain capacitance in such a symmetric device configuration. Specifically, FET saturated currents are more sensitive to source resistance and less sensitive to drain resistance. That is, FET drive current improves more with reduced source resistance, than with reduced drain resistance. Additionally, circuit delay is more sensitive to gate to drain capacitance than gate to source capacitance. That is, due to the Miller effect, the gate to drain capacitance can impact circuit delay significantly more than gate to source capacitance.

An asymmetric FET structure with asymmetrically positioned source region and drain region that allows simultaneously reducing source resistance and gate to drain capacitance thus is desirable. However, this asymmetric device configuration is difficult to implement in conventional planar MOSFETs due to the self-aligned symmetric nature of the gate spacer that is employed to define the positons of the source region and the drain region. Vertical MOSFETs are attractive candidates for 5 nm node and beyond due to better density scaling. The vertical device structure would allow easy incorporation of source/drain asymmetry effects.

SUMMARY

The present application provides a processing scheme for forming vertical FETs with asymmetrically positioned source region and drain region.

According to an aspect of the present application, a semiconductor structure is provided. The semiconductor structure includes a semiconductor fin extending upwards from a semiconductor substrate portion, a source region including a first doped fin region located within a bottom portion of the semiconductor fin and a first doped epitaxial semiconductor region present on sidewalls of the first doped fin region, a drain region including a second doped fin region located within a top portion of the semiconductor fin and a second doped epitaxial semiconductor region present on a topmost surface and sidewalls of the second doped fin region, a metal gate structure along sidewalls of a channel region that is located within a portion of the semiconductor fin and between the first doped fin region and the second doped fin region, and a drain spacer located between the metal gate structure and the second doped epitaxial semiconductor region. The metal gate structure vertically contacts the first doped epitaxial semiconductor region.

According to another aspect of the present application, a method of forming a semiconductor structure is provided. The method includes forming a first doped epitaxial semiconductor region on sidewalls of a portion of a semiconductor fin that is not covered by an insulator layer portion laterally surrounding a base portion of the semiconductor fin and a sacrificial spacer laterally surrounding an upper portion of the semiconductor fin. A source spacer is then formed on the first doped epitaxial semiconductor region. The source spacer laterally surrounds the sacrificial spacer. Next, after removing the sacrificial spacer to expose sidewalls of the upper portion of the semiconductor fin, a metal gate structure is formed over the first doped epitaxial semiconductor region and the source spacer and along sidewalls of a first portion of the upper portion of the semiconductor fin. Next, a drain spacer is formed over the metal gate structure and along sidewalls of a second portion of the upper portion of the semiconductor fin. A second doped epitaxial semiconductor region is then formed on the drain spacer and surrounding a remaining portion of the upper portion of the semiconductor fin.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
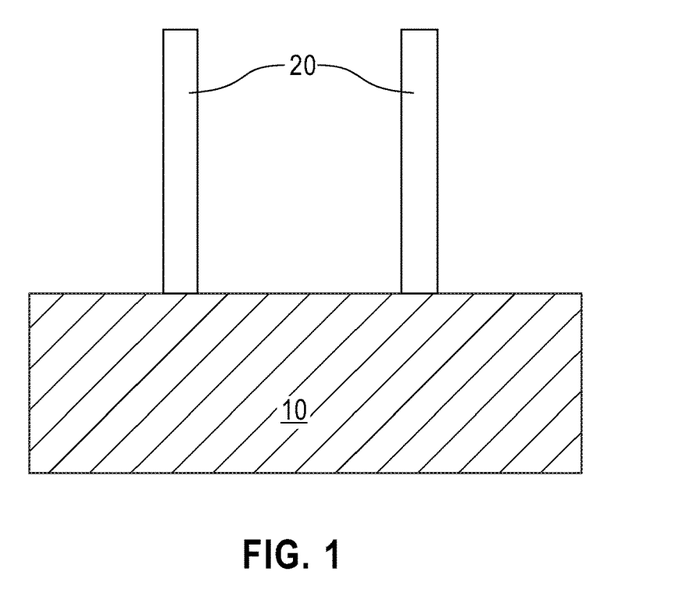
FIG. 1 is a cross-sectional view of an exemplary semiconductor structure including a plurality of semiconductor fins extending upwards from a semiconductor substrate portion according to an embodiment of the present application.

Referring now to FIG. 1, there is illustrated an exemplary semiconductor structure including a plurality of semiconductor fins 20 extending upwards from a remaining portion of a semiconductor substrate (herein referred to as semiconductor substrate portion 10) that can be employed according to an embodiment of the present application.

The exemplary semiconductor structure shown in FIG. 1 can be formed by first providing the semiconductor substrate (not shown). The semiconductor substrate that can be used in the present application is a bulk semiconductor substrate. By "bulk" semiconductor substrate, it is meant a substrate that is entirely composed of at least one semiconductor material having semiconducting properties. In the present application, at least an upper portion of the bulk semiconductor substrate is composed of a semiconductor material including, for example, Si, Ge, SiGe, SiC, SiGeC, III-V compound semiconductors or II-VI compound semiconductors. In one embodiment, the semiconductor substrate is composed entirely of silicon.

The at least one semiconductor material that provides the semiconductor substrate may be single crystalline, polycrystalline or amorphous. In one example, the entirety of, or at least the upper portion of, the semiconductor substrate is composed of a single crystalline semiconductor material such as, for example, single crystalline silicon.

After providing the semiconductor substrate, the semiconductor substrate is then patterned to provide the exemplary semiconductor structure shown in FIG. 1. In the present application, each semiconductor fin 20 is formed within the upper portion of the semiconductor substrate, while the semiconductor substrate portion 10 represents a remaining lower portion of the semiconductor substrate. In one embodiment of the present application, each semiconductor fin 20 has a width from 5 nm to 30 nm, although lesser and greater widths can also be employed. The height of each semiconductor fin 20 can be from 20 nm to 200 nm, although lesser and greater heights can also be employed. Each semiconductor fin 20 is spaced apart from its nearest neighboring semiconductor fin 20 by a distance. In one embodiment, the distance between neighboring semiconductor fins 20 can be from 20 nm to 1000 nm. Also, semiconductor fins 20 are oriented parallel to each other. Each semiconductor fin 20 can have a circular shape or a rectangular shape.

The semiconductor fins 20 can be formed by patterning the upper portion of the semiconductor substrate. In one embodiment of the present application, the patterning used to provide the semiconductor fins 20 may include lithography and etching. Lithography includes forming a photoresist layer (not shown) atop the semiconductor substrate. The photoresist layer may include a positive-tone photoresist material, a negative-tone photoresist material or a hybrid-tone photoresist material. The photoresist layer may be formed by a deposition process such as, for example, spin coating. After forming the photoresist layer, the photoresist layer is subjected to a pattern of irradiation. Next, the exposed photoresist layer is developed utilizing a conventional resist developer. This provides a patterned photoresist layer atop the semiconductor substrate to be patterned. The pattern provided by the patterned photoresist layer is thereafter transferred into the underlying semiconductor substrate utilizing at least one pattern transfer etching process. Typically, the at least one pattern transfer etching process is an anisotropic etch. In one embodiment, a dry etch such as, for example, reactive ion etching (RIE) can be used. In another embodiment, a wet etch utilizing chemical etchant can be used. In still a further embodiment, a combination of dry etch and wet etch can be used. In the illustrated embodiment, the etch stops within a portion of the semiconductor substrate.

In another embodiment of the present application, the patterning used to provide semiconductor fins 20 may include a sidewall image transfer (SIT) process. The SIT process includes forming a mandrel material layer (not shown) atop the semiconductor substrate to be patterned. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal such as, for example, Al, W, or Cu. The mandrel material layer can be formed, for example, by chemical vapor deposition (CVD) or plasma enhanced chemical vapor deposition (PECVD). Following deposition of the mandrel material layer, the mandrel material layer can be patterned by lithography and etching to form a plurality of mandrel structures (also not shown) on the topmost surface of the semiconductor substrate.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in depositing the spacer material include, for example, CVD, PECVD or atomic layer deposition (ALD). Examples of etching that be used in providing the spacers include any etching process such as, for example, RIE.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying semiconductor substrate. The pattern transfer may be achieved by utilizing at least one etching process. Examples of etching processes that can used to transfer the pattern may include dry etch (i.e., RIE, plasma etching, ion beam etching or laser ablation) and/or wet etch. In one example, the etching process used to transfer the pattern may include one or more RIE steps. Upon completion of the pattern transfer, the SIT process concludes by removing the spacers from the structure. Each spacer may be removed by etching or a planarization process.

Figure 2:
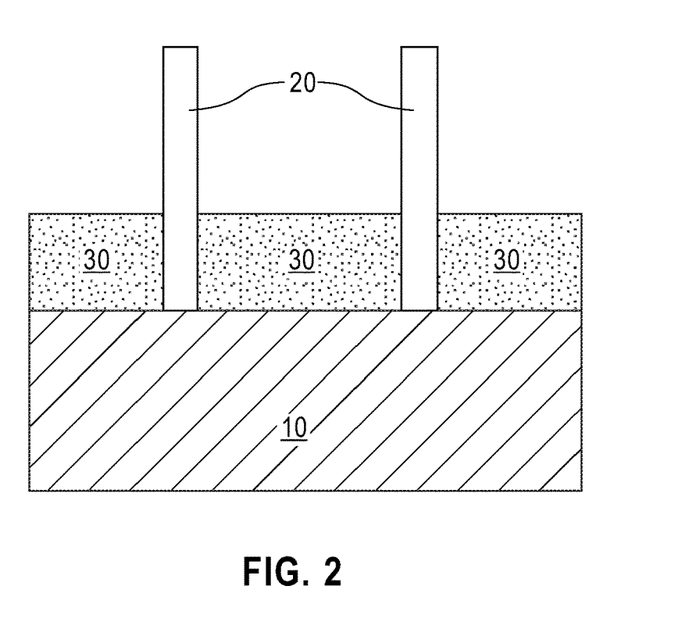
FIG. 2 is a cross-sectional view of the exemplary semiconductor structure of FIG. 1 after forming an insulator layer around the base of each semiconductor fin.

Referring now to FIG. 2, there is illustrated the exemplary semiconductor structure of FIG. 1 after forming an insulator layer 30 around a bottom portion of each semiconductor fin 20. A topmost surface of the insulator layer 30 thus is vertically offset from and located beneath a topmost surface of each semiconductor fin 20. The insulator layer 30 may have a thickness ranging from 50 nm to 80 nm, although lesser and greater thicknesses can also be employed.

The insulator layer 30 may be composed of any dielectric material capable of being removed selectively to sacrificial spacers to be subsequently formed, as described below in conjunction with FIG. 3. In one embodiment, the insulator layer 30 includes a dielectric oxide such as, for example, silicon dioxide. The insulator layer 30 may be formed by depositing a dielectric material over and between the semiconductor fins 20 using a conventional deposition technique, such as, for example, CVD or PVD, planarizing the deposited dielectric material by a conventional planarization technique such as, for example chemical mechanical planarization (CMP), and then etching back the deposited dielectric material to the desired thickness. An anisotropic etch such as, for example, RIE may be employed to remove the dielectric material of the insulator layer 30 selective to the semiconductor material of the semiconductor fins 20.

Figure 3:
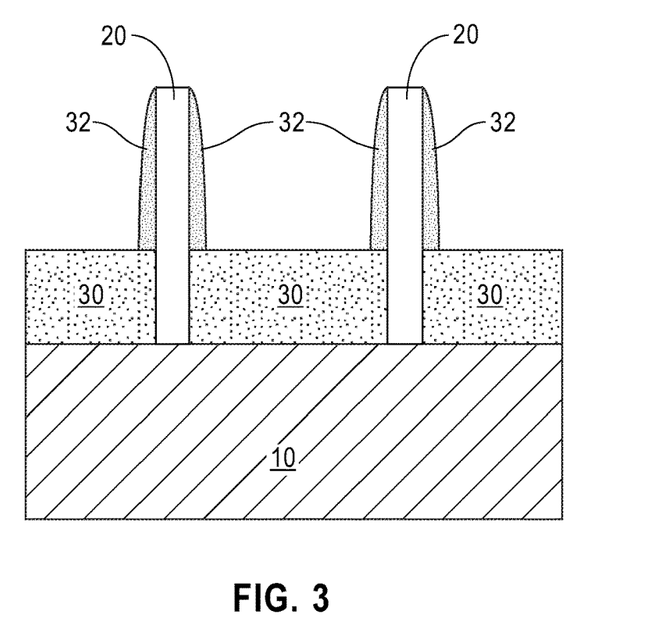
FIG. 3 is a cross-sectional view of the exemplary semiconductor structure of FIG. 2 after forming a sacrificial spacer on sidewalls of each semiconductor fin that are not covered by the insulator layer.

Referring now to FIG. 3, there is illustrated the exemplary semiconductor structure of FIG. 2 after forming a sacrificial spacer 32 on sidewalls of each semiconductor fin 20 that are not covered by the insulator layer 30. Each sacrificial spacer 32 may include a dielectric material that differs from the dielectric material that provides insulator layer 30. Exemplary dielectric materials that can be used in providing each sacrificial spacer 32 include, but are not limited to, an oxide, a nitride and an oxynitride. In one embodiment, each sacrificial spacer 32 is composed of silicon nitride.

The sacrificial spacers 32 can be formed by first conformally depositing a sacrificial spacer material layer (not shown) on exposed surfaces of the each semiconductor fin 20 (i.e., topmost surfaces and sidewall surfaces of the semiconductor fins 20 not covered by the insulator layer 30) and the insulator layer 30 utilizing, for example, CVD or ALD. Subsequently, horizontal portions of the conformal sacrificial spacer material layer are removed by an anisotropic etch such as, for example, RIE. Vertical portions of the conformal sacrificial spacer material layer that remain on the sidewalls of the exposed portion of each semiconductor fin 20 constitutes the sacrificial spacer(s) 32. Each sacrificial spacer 32 can have a width, as measured at the base, from 10 nm to 20 nm, although lesser and greater widths can also be employed. As is shown, each sacrificial spacer 32 has a topmost surface that is coplanar with the topmost surface of each semiconductor fin 20.

Figure 4:
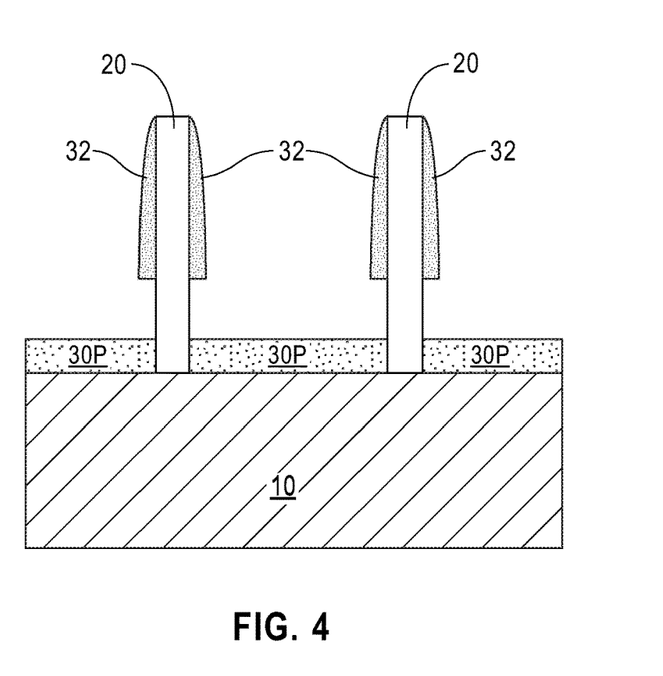
FIG. 4 is a cross-sectional view of the exemplary semiconductor structure of FIG. 3 after recessing the insulator layer to provide an insulator layer portion and to expose sidewalls of a portion of each semiconductor fin that is located between the insulator layer portion and a corresponding sacrificial spacer.

Referring now to FIG. 4, there is illustrated the exemplary semiconductor structure of FIG. 3 after recessing the insulator layer 30 such that a topmost surface of a remaining portion of the insulator layer 30 (herein referred to as an insulator layer portion 30P) is located below the bottommost surfaces of the sacrificial spacers 32. As such, sidewalls of a base portion of each semiconductor fin 20 that is located between the insulator layer portion 30P and a corresponding sacrificial spacer 32 are exposed.

The insulator layer 30 may be recessed using an isotropic etch. The isotropic etch can be a dry etch or a wet etch that removes the dielectric material that provides the insulator layer 30 selective to the semiconductor material that provides the semiconductor fins 20 and the dielectric material that provides the sacrificial spacers 32. In one embodiment, a RIE may be performed. After recessing, the insulator layer portion 30P may have a thickness from 10 nm to 30 nm, although lesser and greater thicknesses can also be employed.

Figure 5:
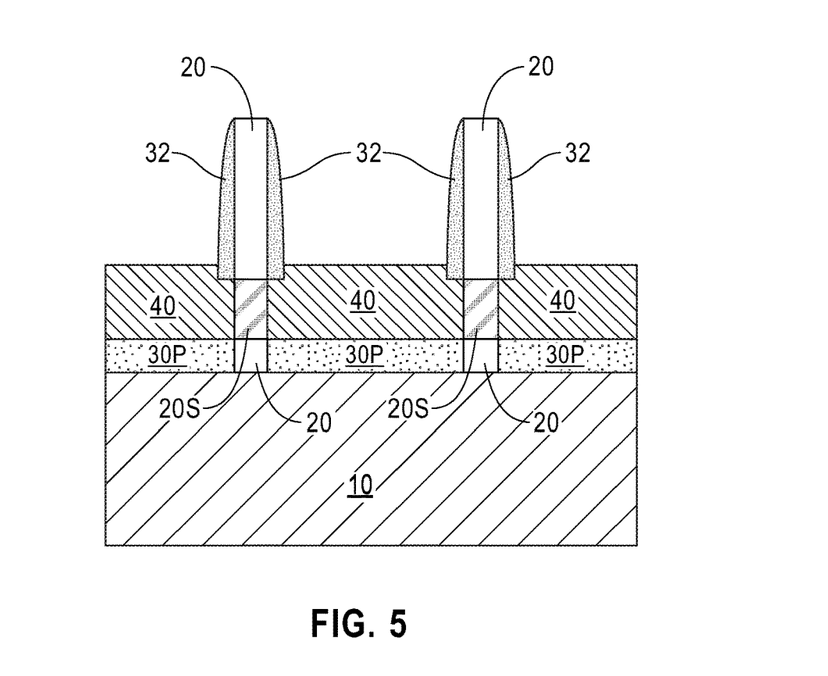
FIG. 5 is a cross-sectional view of the exemplary semiconductor structure of FIG. 4 after forming a first doped epitaxial semiconductor region from the exposed sidewalls of each semiconductor fin.

Referring now to FIG. 5, there is illustrated the exemplary semiconductor structure of FIG. 4 after epitaxially growing a first doped epitaxial semiconductor region 40 from the sidewalls of the physically exposed portion of each semiconductor fin 20 located between the insulator layer portion 30 and the sacrificial spacers 32. In one embodiment, and as is shown, the first doped epitaxial semiconductor region 40 is formed on an entirety of a physically exposed topmost surface of the insulator layer portion 30P. In another embodiment, the first doped epitaxial semiconductor region 40 does not cover all the insulator layer portion 30P; rather it only covers portions of the insulator layer portion 30P near each semiconductor fin 20.

The first doped epitaxial semiconductor region 40 may include any semiconductor material as mentioned above for the semiconductor fins 20 (i.e., semiconductor material that provides the upper portion of the semiconductor substrate). In one embodiment of the present application, the first doped epitaxial semiconductor region 40 includes a same semiconductor material as the semiconductor material that provides the semiconductor fins 20. For example, both the first doped epitaxial semiconductor region 40 and the semiconductor fins 20 may be composed of silicon. In another embodiment of the present application, the first doped epitaxial semiconductor region 40 includes a different semiconductor material than the semiconductor material that provides the semiconductor fins 20. For example, the first doped epitaxial semiconductor region 40 may be composed of SiGe and the semiconductor fins 20 may be composed of silicon.

The first doped epitaxial semiconductor region 40 includes a p-type or an n-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The dopant concentration of the first doped epitaxial semiconductor region 40 can be from $1 \times 10^{20}$ atoms/cm$^3$ to $1 \times 10^{22}$ atoms/cm$^3$, although lesser and greater dopant concentration can also be employed.

The first doped epitaxial semiconductor region 40 may be formed by a selective epitaxial growth process. The selective epitaxial growth process grows the semiconductor material that provides first doped epitaxial semiconductor region 40 only from the semiconductor surfaces (i.e., exposed sidewall surfaces of the semiconductor fins 20), but not from dielectric surfaces, such as surfaces of the insulator layer portion 30P and the sacrificial spacers 32. Examples of various epitaxial growth processes that are suitable for use in forming the first doped epitaxial semiconductor region 40 include, but are not limited to, molecular beam epitaxy (MBE) and metal-organic chemical vapor deposition (MOCVD). The dopant can be provided during selective epitaxial growth process by in-situ doping, or after selective epitaxial growth process by ion implantation or gas phase doping. In one embodiment and as shown, the selective epitaxial growth process can be continued until the first doped epitaxial semiconductor region 40 merges neighboring semiconductor fins 20. After epitaxial growth, the topmost surface of the first doped epitaxial semiconductor region 40 is located above or coplanar with the bottommost surfaces of the sacrificial spacers 32.

The dopant in the first doped epitaxial semiconductor region 40 can be activated for example, by a rapid thermal anneal process. In some embodiments of the present application, the annealing may result in a lateral diffusion of dopant into the bottom portion of each semiconductor fin 20 to provide a first doped fin region 20S within the bottom portion of each semiconductor fin 20. Collectively, each first doped fin region 20S and the first doped epitaxial semiconductor region 40 constitute a source region for a vertical FET subsequently formed.

Figure 6:
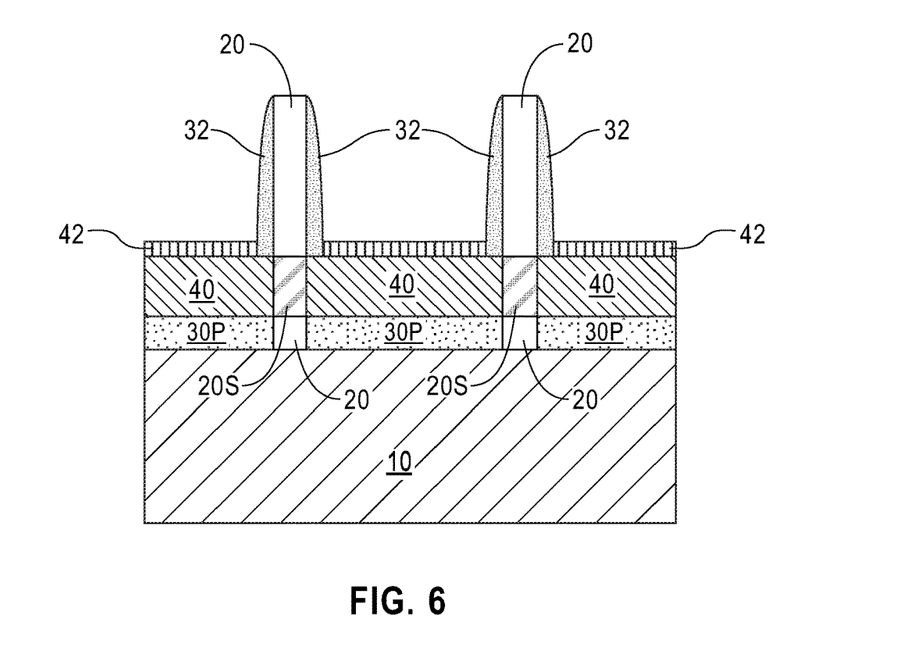
FIG. 6 is a cross-sectional view of the exemplary semiconductor structure of FIG. 5 after forming a source spacer on the first doped epitaxial semiconductor region.

Referring now to FIG. 6, there is illustrated the exemplary semiconductor structure of FIG. 5 after forming a source spacer 42 on a physically exposed surface of the first doped epitaxial semiconductor region 40. The source spacer 42 laterally surrounds the bottom portion of each sacrificial spacer 32. The source spacer 42 separate each source region (40, 20S) from a metal gate structure to be subsequently formed.

The source spacer 42 may include a dielectric material that has a different etching selectivity with respect to the dielectric material that provides the sacrificial spacers 32. In one embodiment, the source spacer 42 includes a dielectric oxide such as, for example, silicon dioxide. In one embodiment, the source spacer 42 may be formed by oxidation of an upper portion of the first doped epitaxial semiconductor region 40 that is not covered by the sacrificial spacers 32. In another embodiment, the source spacer 42 may be formed by a deposition process such as, for example, CVD or PVD followed by planarization and recess of deposited film. The thickness of the source spacer 42 can be from 5 nm to 10 nm, although lesser and greater thickness can also be employed.

Figure 7:
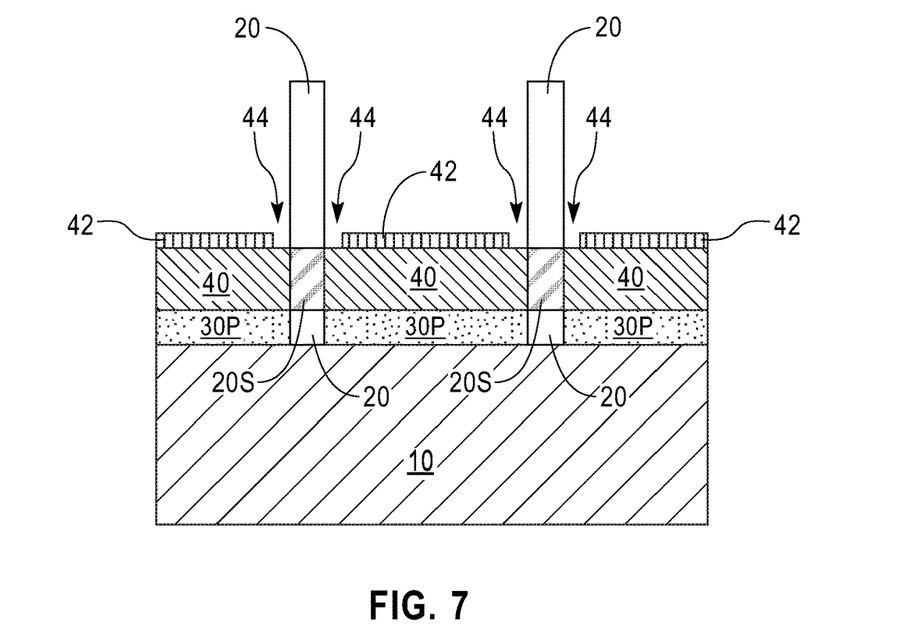
FIG. 7 is a cross-sectional view of the exemplary semiconductor structure of FIG. 6 after removing each sacrificial spacer.

Referring now to FIG. 7, there is illustrated the exemplary semiconductor structure of FIG. 6 after removing the sacrificial spacers 32. The sacrificial spacers 32 can be removed by an isotropic etch or an anisotropic etch. In one embodiment, the sacrificial spacers 32 can be removed by a wet etch. For example, if the sacrificial spacers 32 are composed of silicon nitride, the sacrificial spacers 32 can be removed by a wet etch employing hot phosphoric acid. After removal of the sacrificial spacers 32, a gap 44 is provided between the source spacer 42 and each semiconductor fin 20 occupying a volume from which the each sacrificial spacer 32 is removed. The gap 44 exposes sidewalls of each semiconductor fin 20, sidewalls of the source spacer 42 as well as a topmost surface of a portion of the first doped epitaxial semiconductor region 40 adjoined to each semiconductor fin 20 and not covered by the source spacer 42.

Figure 8:
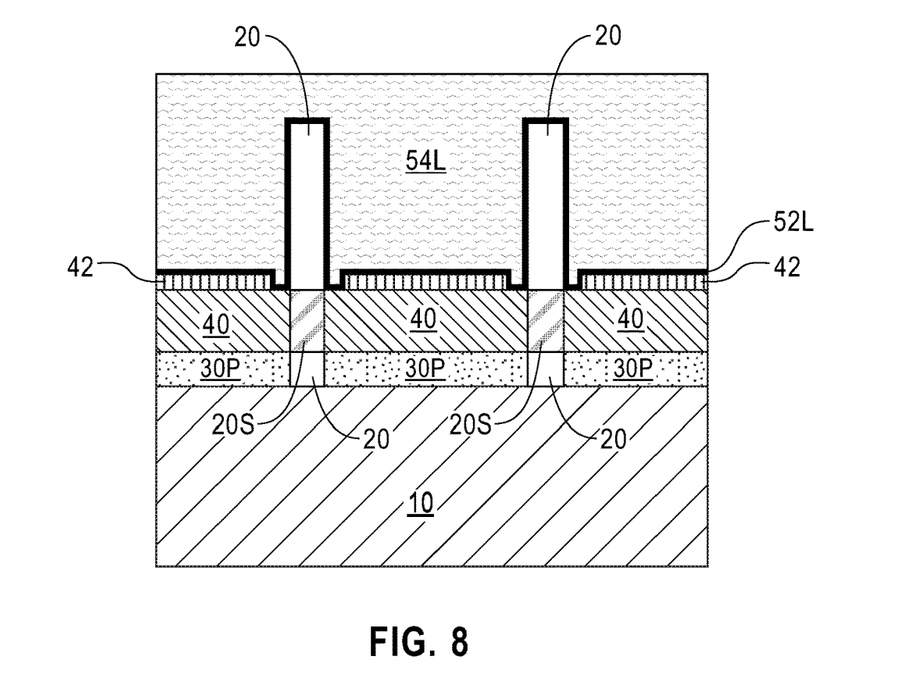
FIG. 8 is a cross-sectional view of the exemplary semiconductor structure of FIG. 7 after forming a gate material stack including a gate dielectric layer and a gate electrode overlying the gate dielectric layer.

Referring now to FIG. 8, there is illustrated the exemplary semiconductor structure of FIG. 7 after forming a gate material stack including a gate dielectric layer 52L present on exposed surfaces of each semiconductor fin 20, the first doped epitaxial semiconductor region 40 and the source spacer 42, and a gate electrode 54L present on the gate dielectric layer 52L. The gate electrode layer 54L completely fills each gap 44 between the source spacer 42 and the semiconductor fins 20.

The gate dielectric layer 52L may include a high-k dielectric material having a dielectric constant greater than silicon oxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, the gate dielectric layer 52L may have a multilayer structure comprising different gate dielectric materials, e.g. silicon dioxide, and a high-k gate dielectric material can be formed. The gate dielectric layer 52L may be formed by any deposition technique including, for example, CVD, PECVD, PVD and ALD. The thickness of the gate dielectric layer 52L can be from 1 nm to 10 nm, although lesser and greater thicknesses can also be employed.

The gate electrode layer 54L may comprise any conductive metal. Exemplary conductive metals that can be employed in the metal gate electrode layer include, but are not limited to, W, Ti, Ta, Al, Ni, Ru, Pd and Pt. In one embodiment, the gate electrode layer 54L is comprised of W. In some embodiments of the present application, the gate electrode layer 54L also contains a work function metal such as, for example, TiAlN, TiN, or TaN. The gate electrode layer 54L may be formed utilizing a deposition process including, for example, CVD, PECVD, PVD, ALD and other like deposition processes. When a metal silicide is formed, a conventional silicidation process is employed. A planarization process, for example, CMP, may be performed to polish the surface of the gate electrode layer 54L.

Figure 9:
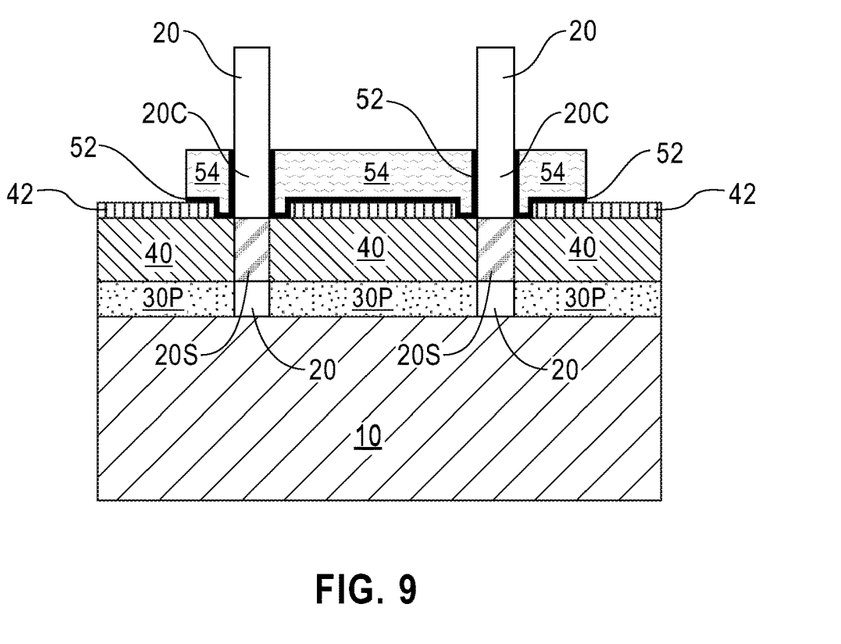
FIG. 9 is a cross-sectional view of the exemplary semiconductor structure of FIG. 8 after forming a metal gate structure including a gate dielectric and a gate electrode.

Referring now to FIG. 9, there is illustrated the exemplary semiconductor structure of FIG. 8 after forming a metal gate structure laterally contacting sidewalls of a channel region 20C of each semiconductor fin 20. The metal gate structure includes a gate dielectric 52 and a gate electrode 54.

The metal gate structure can be formed by first recessing the gate electrode layer 54L by a recess etch. The etch can be a dry etch or a wet etch that removes the conductive metal that provides the gate electrode layer 54L selective to the dielectric material(s) that provides the gate dielectric layer 52. After recessing, a remaining portion of the gate electrode layer 54L has a topmost surface located between the topmost surfaces of the semiconductor fin 20 and a topmost surface of the source spacer 42. Next, end portions of the remaining portion of the gate electrode layer 54L are removed by lithography and etching to provide the gate electrode 54. For example, a photoresist layer (not shown) is applied over the remaining portion of gate electrode layer 54L and lithographically patterned so that a remaining portion of the photoresist layer (i.e., the patterned photoresist layer) covers a portion of the remaining portion of the gate electrode layer 54 where the gate electrode 54 is to be formed. An anisotropic etch is performed to remove the end portions of the remaining portion of the gate electrode layer 54L that are not covered by the patterned photoresist layer to provide the gate electrode 54. The anisotropic etch can be a dry etch such as, for example, RIE or a wet etch. The patterned photoresist layer can be subsequently removed, for example, by ashing.

Next, portions of the gate dielectric layer 52L that are not covered by the gate electrode 54 are removed by an isotropic etch. The isotropic etch can be a dry etch such as, for example, RIE or a wet etch that removes the dielectric material that provides the gate dielectric layer 52L selective to the dielectric material that provides the source spacer 42 and the semiconductor material that provides the semiconductor fins 20. A remaining portion of the gate dielectric layer 52L beneath the gate electrode 54 constitutes the gate dielectric 52. The gate dielectric 52 contacts the sidewalls of the channel region 20C of each semiconductor fin 20, the topmost surface and sidewalls of the source spacer 42 as well as the topmost surface of the portion of the first doped epitaxial semiconductor region 40 adjoined to each semiconductor fin 20 and not covered by the source spacer 42.

Collectively, the gate dielectric 52 and the gate electrode 54 constitute a metal gate structure. The metal gate structure (52, 54) has a lower portion of a first width present on the first doped epitaxial semiconductor region 40 and an upper portion of a second width present on the source spacer 42. The second width is greater than the first width. Thus, the first doped epitaxial semiconductor region 40 is separated from the gate electrode 54 by the gate dielectric 52.

Figure 10:
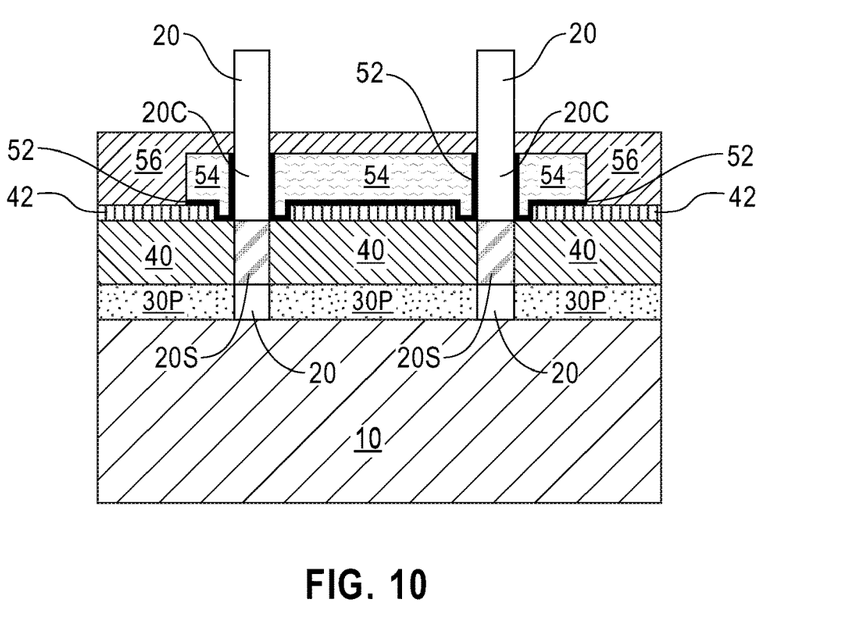
FIG. 10 is a cross-sectional view of the exemplary semiconductor structure of FIG. 9 after forming a drain spacer on the gate electrode and the source spacer.

Referring now to FIG. 10, there is illustrated the exemplary semiconductor structure of FIG. 9 after forming a drain spacer 56 over the gate electrode 54 and the source spacer 42. The drain spacer 56 separates the gate electrode 54 from a drain region of each vertical FET subsequently formed. The drain spacer 56 may include a dielectric material such as, for example, an oxide, a nitride, an oxynitride, or any combination thereof. For example, the second spacer 56 may be composed of silicon nitride, silicon boron carbon nitride (SiBCN), or silicon carbon oxynitride (SiOCN). The drain spacer 56 may be formed by a deposition process such as, for example, CVD or PVD followed by planarization and recess of the film. The drain spacer 56 is formed to a thickness such that a topmost surface of the drain spacer 56 is located below the topmost surface of each semiconductor fin 20. The first thickness of the drain spacer 56 can be from 20 nm to 100 nm, although lesser and greater thicknesses can also be employed. It should be noted that the drain spacer 56 should be thicker than the source spacer 42 so that resistance in the source region and capacitance in the drain region can be reduced simultaneously.

Figure 11:
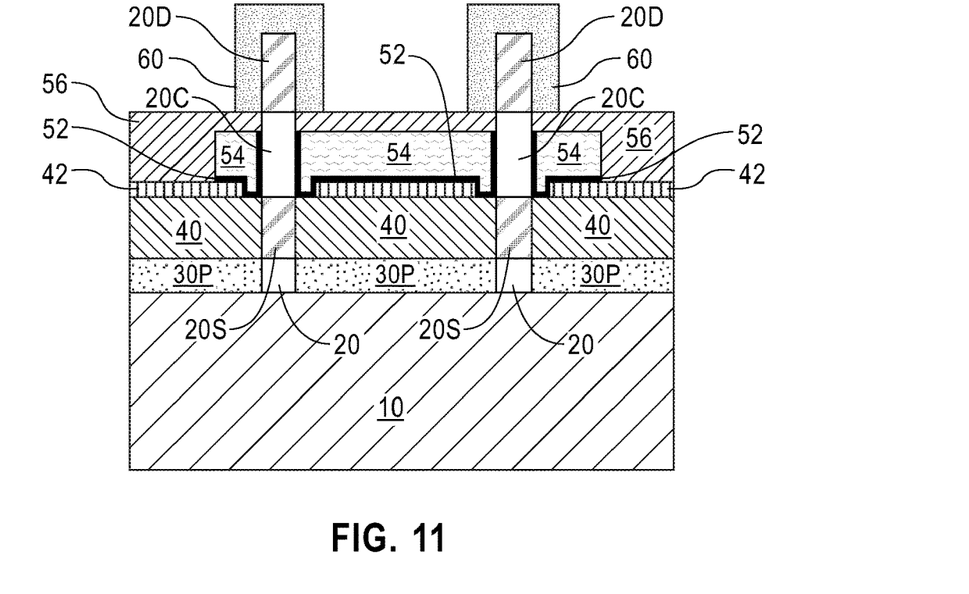
FIG. 11 is a cross-sectional view of the exemplary semiconductor structure of FIG. 10 after forming a second doped epitaxial semiconductor region surrounding a top portion of each semiconductor fin above the drain spacer.

Referring now to FIG. 11, there is illustrated the exemplary semiconductor structure of FIG. 10 after forming a second doped epitaxial semiconductor region 60 surrounding a top portion of each semiconductor fin 20 above the drain spacer 56. Each second doped epitaxial semiconductor region 60 may include a semiconductor material the same as, or different from, the semiconductor material that provides the first doped epitaxial semiconductor layer 40. Each second doped epitaxial semiconductor region 60 also contains a dopant having a conductivity type the same as the conductivity type of the dopant in the first doped epitaxial semiconductor layer 40. For example, for an n-type FET, both first doped epitaxial semiconductor region 40 and the second doped epitaxial semiconductor region 60 can be doped with an n-type dopant. Whereas, for a p-type FET both first doped epitaxial semiconductor region 40 and the second doped epitaxial semiconductor region 60 are doped with a p-type dopant. In some embodiments of the present application, the dopant concentration of each second doped epitaxial semiconductor region 60 can be selected to be less than that of the first doped epitaxial semiconductor region 40. For example, the dopant concentration of each second doped epitaxial semiconductor region 60 can be from $1 \times 10^{20}$ atoms/cm$^3$ to $1 \times 10^{21}$ atoms/cm$^3$, although lesser and greater dopant concentration can also be employed.

Each second doped epitaxial semiconductor region 60 can be formed utilizing a selective epitaxial growth process described above in formation of the first doped epitaxial semiconductor region 40. During the selective epitaxial growth, the semiconductor material that provides each second doped epitaxial semiconductor region 60 only grows from the semiconductor surfaces including physically exposed topmost surfaces and sidewall surfaces of the top portion of each semiconductor fin 20, but not from the dielectric surface such as the topmost surface of the drain spacer 56. The dopant can be provided during the selective epitaxial growth process by in-situ doping, or after the selective epitaxial growth process by ion implantation or gas phase doping.

Subsequently, an anneal is performed to drive dopant in the second doped epitaxial semiconductor region 60 into the top portion of each semiconductor fin 20, forming a second doped fin region 20D in the top portion of each semiconductor fin 20. Each second doped fin region 20D and a surrounding second doped epitaxial semiconductor region 60 together constitute a drain region for each vertical FET.

Vertical FETs are thus formed. Each vertical FET includes a semiconductor fin 20 extending upwards from a semiconductor substrate portion 10, a source region including a first doped fin region 20S located within a bottom portion of the semiconductor fin 20 and a first doped epitaxial semiconductor region 40 contacting sidewalls of the first doped fin region 20S, a drain region including a second doped fin region 20D located within a top portion of the semiconductor fin 20 and a second doped epitaxial semiconductor region 60 contacting a topmost surface and sidewalls of the second doped fin region 20D, and a metal gate structure including a gate dielectric 52 and a gate electrode 54 laterally contacting a channel region 20C of the semiconductor fin 20 located between the first doped fin region 20B and the second doped fin region 20CD. In one embodiment, the first doped semiconductor region 40 merges adjacent semiconductor fins 20, serving as a common source region for adjacent vertical FETs.

Additionally, the source region (40, 20S) is separated from the gate electrode 54 by the gate dielectric 52 and the source spacer 42, whereas the drain region (60, 20D) is separated from the gate electrode 54 by a drain spacer 56. The distance between the source region (40, 20S) and the gate electrode 54 thus can be controlled by the thickness of the gate dielectric 52, and the distance between the drain region (60, 20D) and the gate electrode 54 can be controlled by the drain spacer 56. The distance between the source region (40, 20S) and the gate electrode 54 and distance between the drain region (60, 20D) and the gate electrode 54 can be tailored to ensure that source resistance is minimized and simultaneously to ensure that gate to drain capacitance is minimized. Since the thickness of the gate dielectric 52 can be selected to be smaller than the thickness of the drain spacer 56, this asymmetric configuration allows simultaneous optimization of source resistance and gate to drain capacitance. In addition, in the present application since the dopant concentration in the source region (40, 20S) can be selected to be greater than the dopant concentration in the drain region (40, 20S), the asymmetric source/drain doping allows further optimization of the source resistance and gate to drain capacitance.

Figure 12:
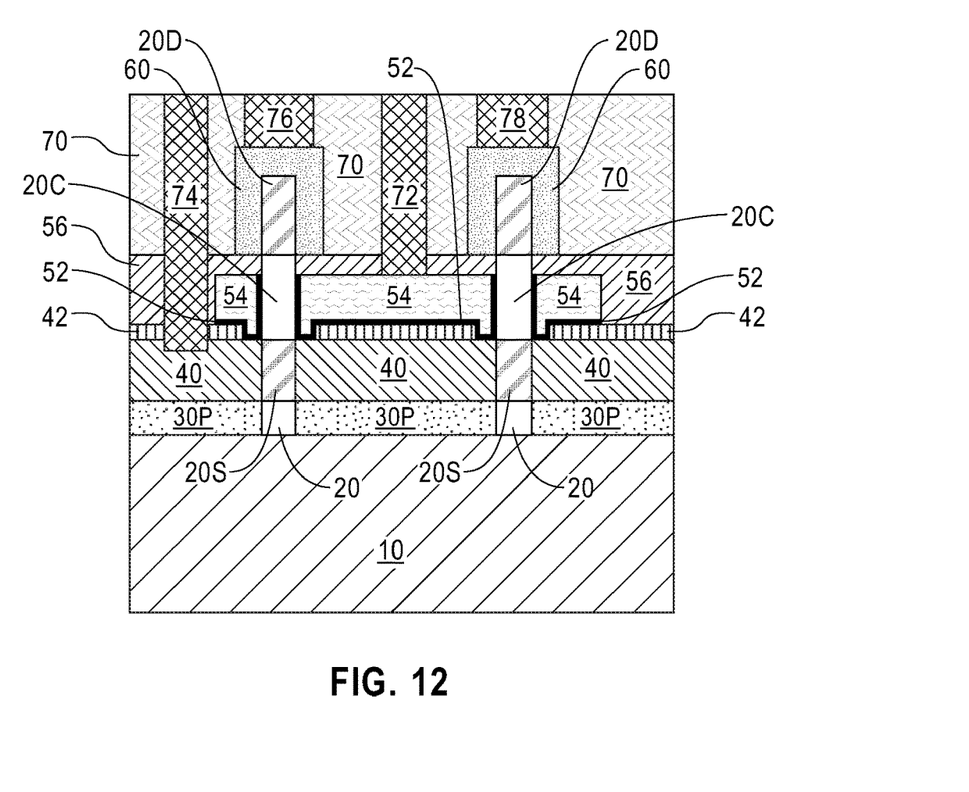
FIG. 12 is a cross-sectional view of the exemplary semiconductor structure of FIG. 11 after forming a contact level dielectric layer over the drain spacer and the second doped epitaxial semiconductor region and forming various contact structures

Referring now to FIG. 12, there is illustrated the exemplary semiconductor structure of FIG. 11 after forming a contact level dielectric layer 70 over the second drain spacer 56 and each second doped epitaxial semiconductor region 60 and forming various contact structures.

The contact level dielectric layer 70 may include a dielectric material such as, for example, oxides, nitrides or oxynitrides. In one embodiment, the contact level dielectric layer 70 includes SiCN. The contact level dielectric layer 70 may be formed, for example, by CVD or spin-coating. The contact level dielectric layer 70 may be self-planarizing, or the topmost surface of the contact level dielectric layer 70 can be planarized, for example, by CMP. In one embodiment, the planarized topmost surface of the contact level dielectric layer 70 is located above a topmost surface of each second doped epitaxial semiconductor region 60.

Subsequently, various contact structures are formed. The contact structures include a gate contact structure 72 extending through the contact level dielectric layer 70 and the drain spacer 56 to form contact with gate electrode 54, a source contact structure 74 extending through the contact level dielectric layer 70, the gate dielectric 52 and the source spacer 42 to form contact with the first doped epitaxial semiconductor region 40, and a drain contact structure 76 extending through the contact level dielectric layer 70 to form contact with each second doped epitaxial semiconductor region 60.

The gate, source and drain contact structures 72, 74, 76 can be formed by formation of contact openings (not shown) within the dielectric material components including the contact level dielectric layer 70, the drain spacer 56, the gate dielectric 52 and the source spacer 42 utilizing a combination of lithographic patterning and anisotropic etch followed by deposition of a conductive material (e.g., copper) and planarization that removes an excess portions of the conductive material from above the topmost surface of the contact level dielectric layer 70. Optionally, contact liners (not shown) may be formed on the sidewalls and bottoms surfaces of the contact openings before filling the contact openings with the conductive material. The contact liners may include TiN.

In some embodiments of the present application, the source contact structure 74 can also be formed as a back contact (not shown). In this case, the source contact structure 74 extends through the semiconductor portion 10 to form contact with the first doped epitaxial semiconductor region 40.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A semiconductor structure comprising:
   a semiconductor fin extending upwards from a semiconductor substrate portion and including a channel region and a bottommost fin portion, wherein the channel region has outermost sidewalls that are vertically aligned to outermost sidewalls of the bottommost fin portion;
   an insulator layer portion laterally surrounding, and directly contacting, the outermost sidewalls of the bottommost fin portion of the semiconductor fin and located entirely on a topmost surface of the semiconductor substrate portion;
   a source region comprising a first doped fin region located within a bottom portion of the semiconductor fin, and a first doped epitaxial semiconductor region present on outermost sidewalls of the first doped fin region and having a bottommost surface that is in direct physcially contact with a topmost surface of the insulator layer portion, wherein the first doped fin region entirely separates the bottommost fin portion from the channel region;
   a drain region comprising a second doped fin region located within a top portion of the semiconductor fin and a second doped epitaxial semiconductor region present on a topmost surface and outermost sidewalls of the second doped fin region;
   a metal gate structure present along the outermost sidewalls of the channel region of the semiconductor fin and between the first doped fin region and the second doped fin region, wherein the metal gate structure vertically contacts the first doped epitaxial semiconductor region; and
   a drain spacer located between the metal gate structure and the second doped epitaxial semiconductor region.

2. The semiconductor structure of claim 1, wherein the metal gate structure comprises a gate dielectric laterally contacting the outermost sidewalls of the channel region and vertically contacting the first doped epitaxial semiconductor region, and a gate electrode located on the gate dielectric, wherein the drain spacer separates the gate electrode from the second doped epitaxial semiconductor region.

3. The semiconductor structure of claim 2, wherein a horizontal portion of the gate dielectric is in direct contact with a portion of the first doped epitaxial semiconductor region that is adjoined to the semiconductor fin.

4. The semiconductor structure of claim 2, wherein a thickness of the gate dielectric is less than a thickness of the drain spacer.

5. The semiconductor structure of claim 1, further comprising a source spacer located over another portion of the first doped epitaxial semiconductor region that is distal from the semiconductor fin.

6. The semiconductor structure of claim 5, wherein the metal gate structure comprises a first portion of a first width in direct contact with the first doped epitaxial semiconductor region and a second portion of a second width overlying the first portion and in direct contact with the source spacer, wherein the second width is greater than the first width.

7. The semiconductor structure of claim 5, wherein the source spacer comprises an oxide of a semiconductor material that provides the first doped epitaxial semiconductor region.

8. The semiconductor structure of claim 1, wherein a dopant concentration of the first doped epitaxial semiconductor region is greater than a dopant concentration of the second doped epitaxial semiconductor region.

9. The semiconductor structure of claim 1, further comprising a gate contact structure contacting a gate electrode in the metal gate structure, a source contact structure contacting the first doped epitaxial semiconductor region, and a drain contact structure contacting the second doped epitaxial semiconductor region.

10. The semiconductor structure of claim 1, further comprising another semiconductor fin located in a different region of the semiconductor substrate portion, wherein the first doped epitaxial semiconductor region merges the semiconductor fin and the another semiconductor fin.

* * * * *